(12) United States Patent
Goto

(10) Patent No.: US 7,272,974 B2
(45) Date of Patent: Sep. 25, 2007

(54) CAPACITANCE TYPE PHYSICAL QUANTITY SENSOR HAVING SENSOR CHIP AND CIRCUIT CHIP

(75) Inventor: Keisuke Goto, Obu (JP)

(73) Assignee: DENSO CORPORATION, Kariya (JP)

( * ) Notice: Subject to any disclaimer, the term of this patent is extended or adjusted under 35 U.S.C. 154(b) by 62 days.

(21) Appl. No.: 11/226,249

(22) Filed: Sep. 15, 2005

(65) Prior Publication Data
US 2006/0065053 A1 Mar. 30, 2006

(30) Foreign Application Priority Data
Sep. 16, 2004 (JP) .............. 2004-269542

(51) Int. Cl.
*G01P 15/125* (2006.01)
(52) U.S. Cl. .................. 73/514.32; 361/280
(58) Field of Classification Search ............ 73/514.32; 361/280
See application file for complete search history.

(56) References Cited
U.S. PATENT DOCUMENTS
6,313,529 B1 * 11/2001 Yoshihara et al. .......... 257/724
6,848,310 B2    2/2005 Goto .................. 73/514.32
6,876,093 B2 *  4/2005 Goto et al. ............... 257/798
6,935,176 B2 *  8/2005 Goto et al. ............. 73/514.32

FOREIGN PATENT DOCUMENTS
JP    A-2002-151703    5/2002

OTHER PUBLICATIONS
Notice of Preliminary Rejection from Korean Patent Office issued on Sep. 26, 2006 for the corresponding Korean patent application No. 10-2005-0086561 (a copy and English translation thereof).

* cited by examiner

*Primary Examiner*—John E. Chapman
(74) *Attorney, Agent, or Firm*—Posz Law Group, PLC

(57) ABSTRACT

A capacitance type physical quantity sensor includes a sensor chip and a circuit chip. The sensor chip includes: a support substrate; a semiconductor layer; a movable electrode; and a fixed electrode. The sensor chip is stacked on the circuit chip such that the movable electrode and the fixed electrode face the circuit chip. The movable electrode has a thickness in a stacking direction. The sensor chip has a first distance between the movable electrode and the circuit chip and a second distance between the movable electrode and the support substrate. The thickness of the movable electrode is larger than the first distance and the second distance.

7 Claims, 4 Drawing Sheets

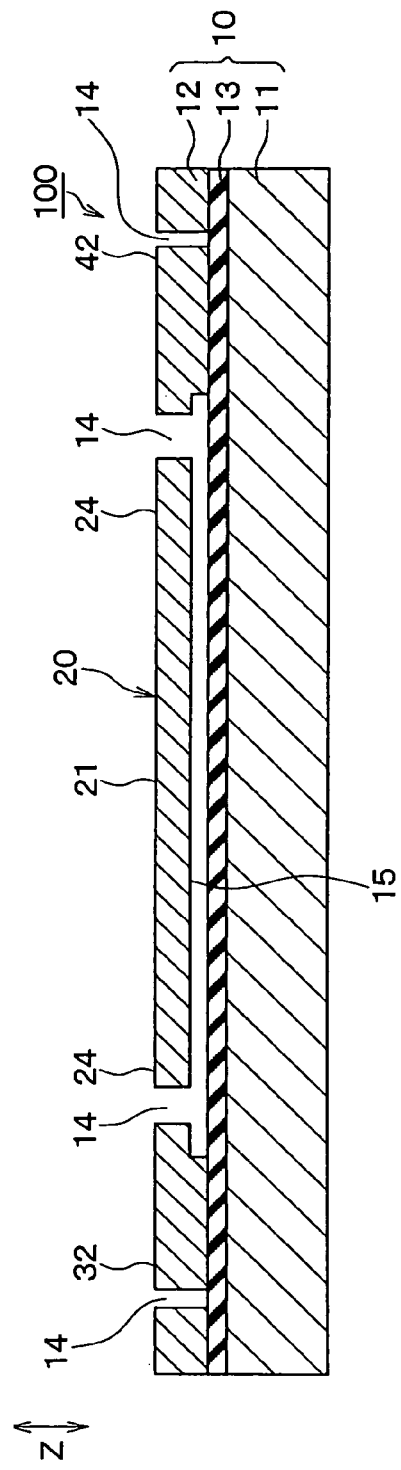
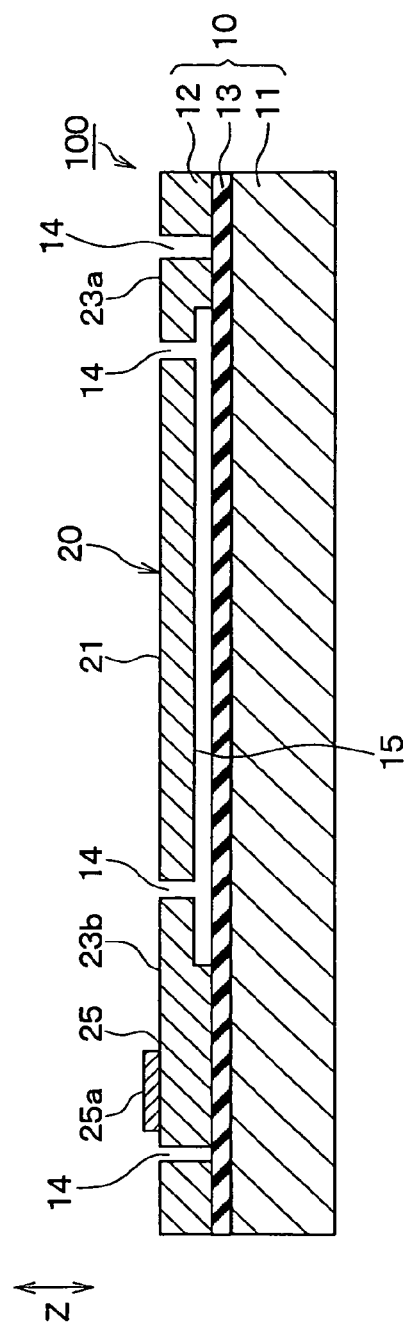

CAPACITANCE TYPE PHYSICAL QUANTITY SENSOR HAVING SENSOR CHIP AND CIRCUIT CHIP

CROSS REFERENCE TO RELATED APPLICATION

This application is based on Japanese Patent Application No. 2004-269542 filed on Sep. 16, 2004, the disclosure of which is incorporated herein by reference.

FIELD OF THE INVENTION

The present invention relates to a capacitance type physical quantity sensor.

BACKGROUND OF THE INVENTION

A capacitance type physical quantity sensor apparatus is manufactured by stacking both a circuit chip and a sensor chip for detecting a physical quantity based upon a capacitance change between a movable electrode and a fixed electrode, while the physical quantity, for instance, an acceleration sensor, an angular velocity sensor, and the like, is applied to the capacitance type physical quantity sensor apparatus.

The sensor chip has been manufactured in such a manner that a movable electrode and a fixed electrode have been formed on a semiconductor layer. The semiconductor layer has been provided via an insulating layer on one plane side of a supporting substrate. The movable electrode can be displaced along a direction parallel to the plane of the supporting substrate in response to an applied physical quantity.

Then, in this sensor chip, when such a physical quantity as acceleration is applied thereto along a direction parallel to the substrate plane, a distance between the movable electrode and the fixed electrode is changed in response to this application of the physical quantity, and thus, the physical quantity is detected based upon a capacitance change defined between the movable electrode and the fixed electrode, which is caused by the above-explained distance change.

In this case, the sensor chip has been manufactured by employing such a stacked layer substrate that the semiconductor layer has been stacked via the insulating layer on the supporting substrate such as an SOI (silicon-on insulator) substrate, or the like.

For instance, a photo-etching process step is carried out from the front surface of the semiconductor layer so as to form trenches. These formed trenches are used to define patterns of both the movable electrode and the fixed electrode. Thereafter, an etching process is carried out from the supporting substrate so as to form an opening portion which is reached to the insulating layer.

Subsequently, the insulating layer which is contacted to the movable electrode is etched so as to be removed, so that the movable electrode is brought into a release condition. Thus, the sensor chip can be manufactured in accordance with this manner.

Then, this sensor chip has been stacked on a circuit chip on the side of the supporting substrate, and both the sensor chip and the circuit chip have been fixed to each other via an adhesive film, and the like. Also, the sensor chip has been electrically connected to the circuit chip by way of a bonding wire.

On the other hand, as to sensor chips having movable electrodes, such capacitance type acceleration sensors having structures in which glass caps for restricting excessively large displacement of the movable electrodes are covered on the sensor chips have been conventionally proposed, for example, in Japanese Laid-open Patent Application No. 2002-151703.

However, in such a conventional capacitance type physical quantity sensor apparatus, when an excessively large shock is applied along a thickness direction of the sensor chip, namely, along a stacked layer direction of both the sensor chip and the circuit chip, there are some possibilities that the movable electrode exceeds the range of the thickness thereof to be displaced along the above-explained direction, and then, this movable electrode runs onto the adjoining fixed electrode.

In particular, normally, a thickness of the supporting substrate which constitutes the sensor chip is considerably thicker than a thickness of the movable electrode, namely, a thickness of the semiconductor layer.

Then, in the sensor chip, since the opening portion has been formed in the supporting substrate which is located under the movable electrode, the movable electrode may be easily and largely displayed along the upper direction and the lower direction, namely the thickness direction of the sensor chip, and thus, as previously explained, the movable electrode may easily run onto the fixed electrode.

One conceivable idea for solving this technical difficulty, is to include a cap for covering a sensor chip and restricting large displacement of a movable electrode (mass body). In this conceivable idea, there are such problems that the cap member is required to separate, and since this cap is formed, the structure of the sensor apparatus becomes complex and the cumbersome manufacturing process is required.

SUMMARY OF THE INVENTION

In view of the above-described problem, it is an object of the present invention to provide a capacitance type physical quantity sensor having a circuit chip and a sensor chip.

A capacitance type physical quantity sensor includes: a sensor chip for detecting a physical quantity; and a circuit chip for processing a signal outputted from the sensor chip. The sensor chip includes: a support substrate; a semiconductor layer disposed on one side of the substrate; a movable electrode disposed in the semiconductor layer and displaceable in a direction parallel to the substrate in accordance with the physical quantity; and a fixed electrode disposed in the semiconductor layer and facing the movable electrode. The sensor chip is capable of detecting the physical quantity on the basis of a capacitance change of a capacitor provided between the movable electrode and the fixed electrode. The capacitance change is provided by a displacement of the movable electrode in accordance with the physical quantity. The sensor chip is stacked on the circuit chip in such a manner that the movable electrode and the fixed electrode face the circuit chip. The sensor chip is electrically connected to the circuit chip. The movable electrode has a thickness in a stacking direction of the sensor chip. The sensor chip has a first distance between the movable electrode and the circuit chip and a second distance between the movable electrode and the support substrate. The thickness of the movable electrode is larger than the first distance and the second distance.

In the above sensor, when the movable electrode is displaced in the stacking direction of the sensor chip, the support substrate and the circuit chip work as a stopper for limiting the displacement of the movable electrode. Thus, the displacement range of the movable electrode is limited in a range of the thickness of the movable electrode. Therefore, the movable electrode is prevented from running on, i.e., hitting on the fixed electrode.

Preferably, the sensor chip is electrically connected to the circuit chip through a bump electrode. More preferably, the bump electrode has a thickness in the stacking direction of the sensor chip, and the thickness of the bump electrode is equal to the first distance. More preferably, the sensor chip further includes a concavity disposed on a part of the sensor chip. The bump electrode has a part, which is inserted into the concavity. The other part of the bump electrode is protruded from the concavity. The other part of the bump electrode has a thickness in the stacking direction of the sensor chip, and the thickness of the other part of the bump electrode is equal to the first distance.

Preferably, the circuit chip includes a protection film disposed on one side of the circuit chip, and the protection film faces the movable electrode so that a distance between a surface of the protection film and the movable electrode provides the second distance. More preferably, the protection film is capable of protecting the one side of the circuit chip.

Preferably, the sensor chip further includes an insulation layer disposed between the support substrate and the semiconductor layer, and the second distance is provided between the movable electrode and the insulation layer. More preferably, the movable electrode is supported on the substrate through the insulation layer in such a manner that the movable electrode is separated from the substrate by the second distance, and the movable electrode has a displacement range, which is limited between the insulation layer and the one side of the circuit chip.

BRIEF DESCRIPTION OF THE DRAWINGS

The above and other objects, features and advantages of the present invention will become more apparent from the following detailed description made with reference to the accompanying drawings. In the drawings:

FIG. 2 is a cross sectional view showing the sensor chip taken along line II-II in FIG. 1;

FIG. 3 is a cross sectional view showing the sensor chip taken along line III-III in FIG. 1;

DETAILED DESCRIPTION OF THE PREFERRED EMBODIMENTS

First Embodiment

Figure 8:
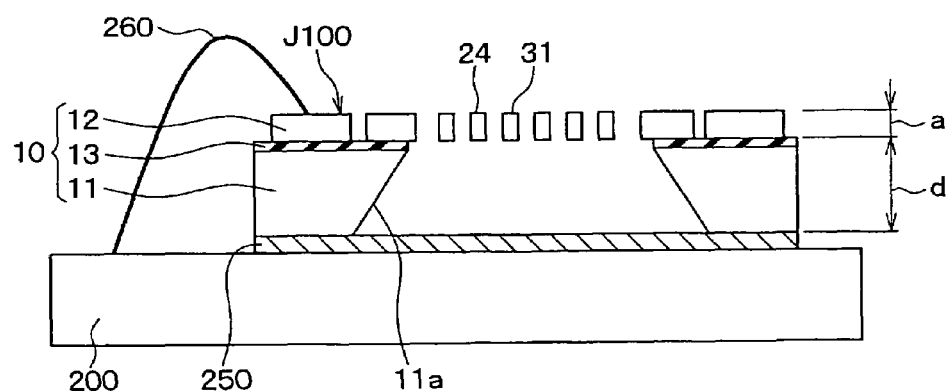
FIG. 8 is a cross sectional view showing a rear surface processing type physical quantity sensor according to a comparison of the first to third embodiments.

FIG. 8 is a diagram for schematically indicating a sectional construction of a general-purpose capacitance type physical quantity sensor apparatus, which is manufactured as a comparison of a first embodiment of the present invention.

A sensor chip J100 shown in FIG. 8 has been manufactured in such a manner that a movable electrode 24 and a fixed electrode 31 arranged opposite to this movable electrode 24 have been formed on a semiconductor layer 12. The semiconductor layer 12 has been provided via an insulating layer 13 on one plane side of a supporting substrate 11. The movable electrode 24 can be displaced along a direction parallel to the plane of the supporting substrate 11 in response to an applied physical quantity.

Then, in this sensor chip J100, when such a physical quantity as acceleration is applied thereto along a direction parallel to the substrate plane, for example, along a right and left direction shown in FIG. 8, a distance between the movable electrode 24 and the fixed electrode 31 is changed in response to this application of the physical quantity, and thus, the physical quantity is detected based upon a capacitance change defined between the movable electrode 24 and the fixed electrode 31, which is caused by the above-explained distance change.

In this case, the sensor chip J100 shown in FIG. 8 has been manufactured by employing such a stacked layer substrate that the semiconductor layer 12 has been stacked via the insulating layer 13 on the supporting substrate 11 such as an SOI (silicon-on insulator) substrate, or the like.

For instance, a photo-etching process step is carried out from the front surface of the semiconductor layer 12 so as to form trenches. These formed trenches are used to define patterns of both the movable electrode 24 and the fixed electrode 31. Thereafter, an etching process is carried out from the supporting substrate 11 so as to form an opening portion 11a which is reached to the insulating layer 13.

Subsequently, the insulating layer 13 which is contacted to the movable electrode 24 is etched so as to be removed, so that the movable electrode 24 is brought into a release condition. Thus, the sensor chip J100 can be manufactured in accordance with this manner.

Then, this sensor chip J100 has been stacked on a circuit chip 200 on the side of the supporting substrate 11, and both the sensor chip J100 and the circuit chip 200 have been fixed to each other via an adhesive film 250, and the like. Also, the sensor chip J100 has been electrically connected to the circuit chip 200 by way of a bonding wire 260.

A glass cap (not shown) for restricting excessively large displacement of the movable electrodes covers the sensor chip J100.

However, in such a capacitance type physical quantity sensor apparatus shown in FIG. 8, when an excessively large shock is applied along a thickness direction of the sensor chip J100, namely, along a stacked layer direction of both the sensor chip J100 and the circuit chip 200, there are some possibilities that the movable electrode 24 exceeds the range of the thickness thereof to be displaced along the above-explained direction, and then, this movable electrode 24 runs onto the adjoining fixed electrode 31.

In particular, as indicated in FIG. 8, normally, a thickness "d" of the supporting substrate 11 which constitutes the sensor chip J100 is considerably thicker than a thickness "a" of the movable electrode 24, namely, a thickness "a" of the semiconductor layer 12.

Then, in the sensor chip J100 shown in FIG. 8, since the opening portion 11a has been formed in the supporting substrate 11 which is located under the movable electrode 24, the movable electrode 24 may be easily and largely displaced along the upper direction and the lower direction shown in this drawing, namely the thickness direction of the sensor chip J100, and thus, as previously explained, the movable electrode 24 may easily run onto the fixed electrode 31.

As to this technical difficulty, a cap (not shown) covers the sensor chip J100 so as to restrict large displacement of the movable electrode (mass body) 24. In this case, it is required to form the cap member separate from the sensor chip J100. Since this type of cap is formed, the structure of the sensor apparatus becomes complex and the cumbersome manufacturing process is required.

A first embodiment mode of the present invention is realized by that the present invention has been applied to a differential capacitance type semiconductor acceleration sensor apparatus (capacitance type acceleration sensor apparatus) as a capacitance type physical quantity sensor apparatus.

This capacitance type acceleration sensor apparatus may be applied to various sorts of sensors such as automobile-purpose acceleration sensors and gyro-sensors, which are used to control actions as to, for example, air bags, ABS, and VSC.

Figure 1:
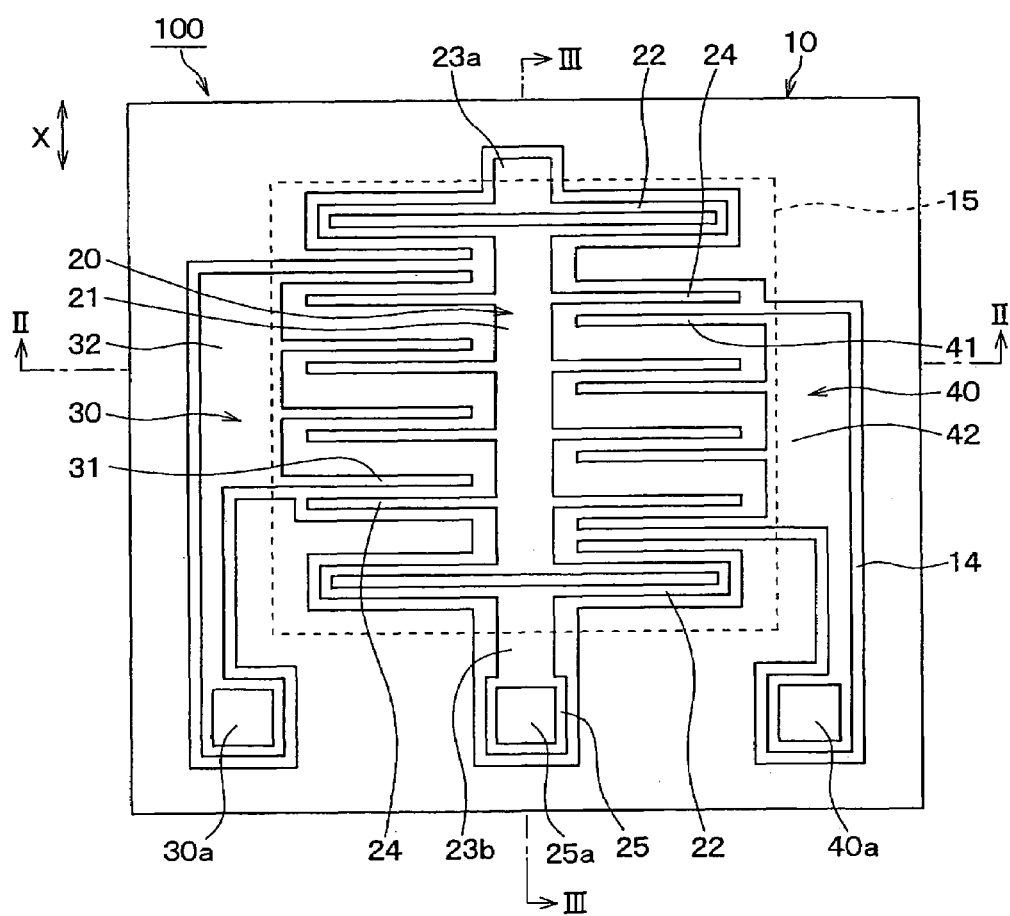
FIG. 1 is a plan view showing a sensor chip of a capacitance type acceleration sensor apparatus according to a first embodiment of the present invention.

FIG. 1 is a plan view for schematically showing a sensor chip 100 employed in a capacitance type acceleration sensor apparatus "S1" according to the first embodiment mode of the present invention. Also, FIG. 2 is a sectional view for schematically indicating the sensor chip 100, taken along a line II-II of FIG. 1. FIG. 3 is a sectional view for schematically showing the sensor chip 100, taken along a line III-III of FIG. 1.

Figure 4:
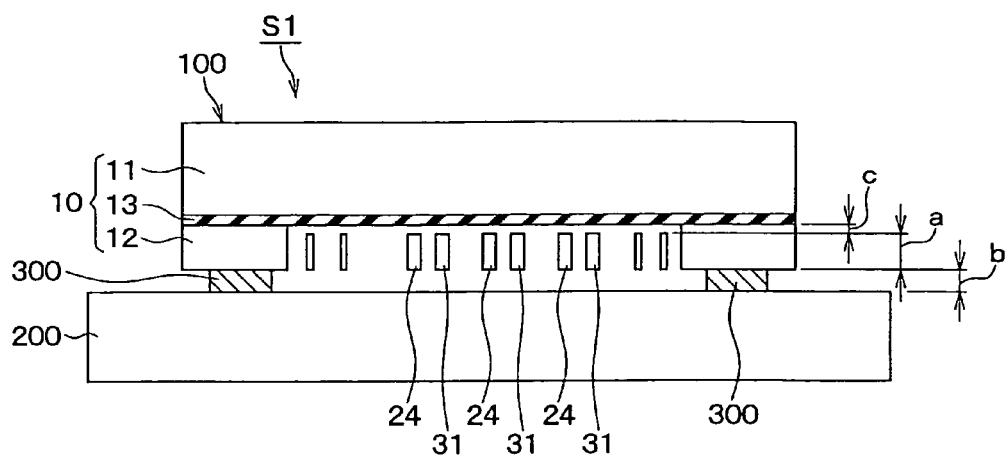
FIG. 4 is a cross sectional view showing the capacitance type acceleration sensor apparatus according to the first embodiment.

Also, FIG. 4 is a sectional view for schematically representing such a condition that the sensor chip 100 shown in FIG. 1 has been mounted on the circuit chip 200, namely a sectional view for schematically indicating the capacitance type acceleration sensor apparatus S1 according to this first embodiment mode.

First, the sensor chip 100 will now be explained with reference to FIG. 1 to FIG. 3. This sensor chip 100 may be manufactured by performing a well-known micro-machining process with respect to a semiconductor substrate 10.

In this example, as shown in FIG. 2 and FIG. 3, the semiconductor substrate 10 which constitutes the sensor chip 100 corresponds to a rectangular-shaped SOI (silicon-on insulator) substrate 10 having an oxide film 13 functioning as an insulating layer between a first silicon substrate 11 functioning as a first semiconductor layer and a second silicon substrate 12 functioning as a second semiconductor layer. Here, the first silicon substrate 11 works as a supporting substrate.

Now, in this first embodiment mode, the first silicon substrate 11 containing the oxide film 13 has been constructed as a supporting substrate. In other words, one plane of the first silicon substrate 11 has been constituted as the oxide film 13, and the second silicon substrate 12 functioning as the semiconductor layer has been provided on the side of one plane of the first silicon substrate 11 corresponding to this supporting substrate.

Since trenches 14 have been formed in the second silicon substrate 12 in such a manner that the trenches 14 penetrate through this silicon substrate 12 along the thickness direction thereof, patterns segmented by the trenches 14 have been formed on this second silicon substrate 12, namely, a beam structural body having a comb teeth shape, which is arranged by both a movable unit 20 and fixed units 30 and 40, has been formed in the second silicon substrate 12.

Also, such a portion which corresponds to the forming regions of the above-described beam structural bodies 20 to 40 within the second silicon substrate 12, namely, a portion indicated by a rectangle portion 15 of a broken line shown in FIG. 1 has been made thin in order that this portion 15 is located apart from the oxide film 13 (see FIG. 2 and FIG. 3).

It is so assumed that the portion of this rectangle portion 15 corresponds to a thin wall rectangle portion 15 formed in the second silicon substrate 12. In other words, this thin wall rectangle portion 15 has been arranged via a gap with respect to one plane of the first silicon substrate 11 functioning as the supporting substrate, namely the oxide film 13.

Such a sensor chip 100 is manufactured in accordance with the below-mentioned manner. While a photolithographic technique is employed, a mask having shapes which correspond to the beam structural bodies is formed on the second silicon substrate 12 of the SOI substrate 10.

Thereafter, a trench etching process is carried out by way of a dry etching process, or the like, while gas of $CF_4$, or $SF_6$ is employed so as to form the trenches 14, so that the patterns of the beam structural bodies 20 to 40 are formed in a batch process.

Subsequently, the trench etching process is further advanced, and a lower portion of the second silicon substrate 12 is furthermore removed by way of a side etching process so as to form the above-described thin wall rectangle portion 15. Thus, the movable unit 20 is released, so that the sensor chip 100 can be manufactured in the above-described manufacturing manner.

In this sensor chip 100, the movable unit 20 functioning as the thin wall rectangle portion 15 has been arranged in such a manner that both edge portions of an elongated rectangular-shaped weight unit 21 have been coupled via a spring unit 22 to both an anchor unit 23a and another anchor unit 23b in an integral body.

As shown in FIG. 3, these anchor units 23a and 23b have been fixed on the oxide film 13, and have been supported via this oxide film 13 on the first silicon substrate 11 functioning as the supporting substrate. As a result, both the weight unit 21 and the spring unit 22, which correspond to the thin wall rectangle portion 15, are brought into such a condition that these weight unit 21 and spring unit 22 are separated from the oxide film 13.

In this example, as represented in FIG. 1, the spring unit 22 has been formed as follows: That is, two sets of parallel beams constitute a rectangular frame shape made by coupling both edges of these beams to each other, and the spring unit 22 owns a spring function by which this spring unit 22 is displaced along a direction perpendicular to the longitudinal direction of the two beams.

Concretely speaking, when the spring unit 22 receives such an acceleration containing an acceleration component along an arrow "X" direction shown in FIG. 1, this spring unit 22 may cause the weight unit 21 to be displaced along the arrow "X" direction in the horizontal direction of the substrate plane, and this spring unit 22 may be recovered to the original state thereof in response to disappearance of the applied acceleration.

As a consequence, the movable unit 20 which has been coupled via such a spring unit 22 to the SOI substrate 10 may be displaced over the oxide film 13, namely the first silicon substrate 11 corresponding to the supporting substrate, along the above-described arrow "X" direction in the horizontal direction of the substrate plane.

Also, as shown in FIG. 1, the movable unit 20 has been equipped with a comb teeth-shaped movable electrode 24 functioning the thin wall rectangle portion 15. This movable electrode 24 has been formed in such a manner that a plurality of beam-shaped movable electrodes are elongated along opposite directions from both side surfaces of the weight unit 21 along a direction perpendicular to the longitudinal direction (arrow "X" direction) of the weight unit 21.

In other words, assuming now that the longitudinal direction of the weight unit 21 is defined as an array direction, plural sets of the movable electrodes 24 have been arrayed in the comb tooth shape along such an array direction. This longitudinal direction corresponds to the displace direction of the spring unit 22, namely, the arrow "X" direction.

In FIG. 1, eight sets of the movable electrodes 24 have been formed in total in such a manner that four sets of these movable electrodes 24 are projected on both a right side and a left side of this weight unit 21 respectively. Each of these movable electrodes 24 has been formed in a rectangular beam shape as viewed in a sectional plane thereof, and has been brought into such a condition that this movable electrode 24 is separated from the oxide film 13.

Since each of the movable electrodes 24 has been formed with both the spring unit 22 and the weight unit 21 in the integral body, each of the movable electrodes 24 may be displaced along the arrow "X" direction within the horizontal direction of the substrate plane.

Also, as shown in FIG. 1 to FIG. 3, both the fixed units 30 and 40 have been fixed onto the oxide film 13 in an outer peripheral portion of one set of opposite edge portions within the outer peripheral portion of the thin wall rectangle portion 15, by which the anchor units 23a and 23b are not supported. Then, both the fixed units 30 and 40 have been supported via the oxide film 13 on the first silicon substrate 11.

As in FIG. 1, the fixed unit 30 located on the left side of the weight unit 21 has been constituted by both a left-sided fixed electrode 31 and a left-sided fixed electrode-purpose wiring unit 32. On the other hand, in FIG. 1, the fixed unit 40 located on the right side of the weight unit 21 has been constituted by both a right-sided fixed electrode 41 and a right-sided fixed electrode-purpose wiring unit 42.

In this example, as shown in FIG. 1, while each of the left-sided fixed electrode 31 and the right-side fixed electrode 41 corresponds to the thin wall rectangle portion 15, plural pieces of these right and left-sided fixed electrodes 31 and 41 have been arranged in a comb tooth shape in such a manner that these plural fixed electrodes may be meshed with gaps among the comb teeth formed in the movable electrode 24.

In this case, in FIG. 1, the left-sided fixed electrode 31 has been provided on the upper side along the arrow "X" direction with respect to each of the movable electrodes 24 on the left side of the weight unit 21. On the other hand, the right-sided fixed electrode 41 has been provided on the lower side along the arrow "X" direction with respect to each of the movable electrodes 24 on the right side of the weight unit 21.

While the respective fixed electrodes 31 and 41 have been arranged opposite to each other with respect to the respective movable electrodes 24 in the horizontal direction of the substrate plane, a detection interval used to detect a capacitance has been formed between a side plane (namely, detection plane) of the movable electrode 24, and side planes (namely, detection planes) of the fixed electrodes 31 and 41 has been formed in each of the opposite intervals.

Also, the left-sided fixed electrode 31 and the right-sided fixed electrode 41 are electrically independent from each other. Then, each of the fixed electrodes 31 and 41 has been formed in a rectangular beam shape (as viewed in sectional plane thereof) which is elongated substantially parallel to the movable electrode 24.

Both the left-sided fixed electrode 31 and the right-sided fixed electrode 41 have been brought into such a condition that these fixed electrodes 31 and 41 are cantilevered to the respective fixed electrode-purpose wiring units 32 and 42 which are fixed via the oxide film 13 to the first silicon substrate 11. Then, the respective fixed electrodes 31 and 41 have been brought into such a condition that these fixed electrodes 31 and 41 are separated from the oxide film 13.

As to both the left-sided fixed electrode 31 and the right-sided fixed electrode 41, the plural electrodes have been combined with each other at the respective wiring units 32 and 42 which are commonly and electrically provided.

Also, both a left-sided fixed electrode-purpose pad 30a and a right-side fixed electrode-purpose pad 40a have been formed at predetermined positions on the left-sided fixed electrode-purpose wiring unit 32 and the right-sided fixed electrode-purpose wiring unit 42, respectively.

Also, a movable electrode-purpose wiring unit 25 has been formed under such a condition that this movable electrode-purpose wiring unit 25 has been coupled to one anchor unit 23b in an integral body, while a movable electrode pad 25a has been formed at a predetermined position on this wiring unit 25. The above electrode-purpose pads 25a, 30a, 40a have been formed by sputtering, or vapor-depositing, and, for example, made of aluminum.

As represented in FIG. 4, the sensor chip 100 having the above structure has been arranged on the circuit chip 200 under such a condition that this circuit chip 200 is located opposite to one plane (13) side of the first silicon substrate 11 in the sensor chip 100.

In other words, the sensor chip 100 and the circuit chip 200 have been stacked to be packaged under such a condition that the movable electrode 24 and the fixed electrodes 31 and 41, which have been formed on the side of one plane 13 of the first silicon substrate 11 in the sensor chip 100, are located opposite to the circuit chip 200.

This circuit chip 200 corresponds to such a circuit chip that a detection circuit (refer to FIG. 5 which will be explained later) for processing an output signal from the sensor chip 100, and a circuit for an investigation have been formed. For example, the circuit chip 200 corresponds to such a semiconductor chip that MOS transistor elements and the like have been formed on a semiconductor substrate such as a silicon substrate by employing a semiconductor process so as to construct a circuit.

Then, the sensor chip 100 has been electrically connected to the circuit chip 200 via the opposite planes thereof. In other words, the front surface of the second silicon substrate 12 employed in the sensor chip 100 has been electrically connected to the plane of the circuit chip 200, which is located opposite to the above-described front surface.

The fixed electrode pads 30a and 40a, which are connected to the respective fixed electrodes 31 and 41, the movable electrode pad 25a, and an electrode (not shown in this drawing) on the circuit chip 200, have been electrically connected to each other via a bump electrode 300. As this bump electrode 300, the normal bump such as solder bump may be employed.

The sensor chip 100 in which the forming plane side of the movable unit 20 constitutes a face plane has been mounted on the circuit chip 200 under face down condition, whereas the fixed electrodes 31 and 41, the movable electrode 25, and the circuit chip 200 have been electrically connected to each other via the bump electrode 300.

In such a capacitance type acceleration sensor apparatus S1, as indicated in FIG. 4, assuming now that a thickness of the movable electrode 24 along the stacked layer direction of both the sensor chip 100 and the circuit chip 200 is equal to "a"; a distance of a gap between the movable electrode 24 and the circuit chip 200 is equal to "b"; and a distance of a gap between the movable electrode 24 and one plane 13 of the supporting substrate 11 is equal to "c", both the distance "b" and the distance "c" are made smaller than the thickness "a".

In particular, while the sensor chip 100 has been electrically connected via the bump electrode 300 to the circuit chip 200, since the thickness of the bump electrode 300 is made thin in order that this thickness of the bump electrode 300 may become equal to the distance "b", this distance "b" may become smaller than the thickness "a".

The capacitance type acceleration sensor apparatus S1 arranged by assembling the sensor chip 100 with the circuit chip 200 may be assembled in such a manner that, for instance, a solder bump is supplied onto the electrode of the circuit chip 200, and thereafter, the sensor chip 100 is mounted on the circuit chip 200 and a solder reflow process is carried out.

Next, a description is made of detecting operations as to the capacitance type acceleration sensor apparatus S1 according to this first embodiment mode. Acceleration is detected based upon a change in electrostatic capacitances between the movable electrode 24 and the fixed electrodes 31 and 41 in response to an application of the acceleration.

In the sensor chip 100, the side planes (namely, detection planes) of the respective fixed electrodes 31 and 41 have been provided opposite to the side plane (namely, detection plane) of each of the movable electrodes 24. Thus, in the respective opposite intervals of the side planes of these movable electrode 24 and fixed electrodes 31 and 41, detection intervals used to detect electrostatic capacitances have been formed.

In this case, it is so assumed that a first capacitance "CS1" has been formed as the detection capacitance in the interval between the left-sided fixed electrode 31 and the movable electrode 24, and on the other hand, a second capacitance "CS2" has been formed as the detection capacitance in the interval between the right-sided fixed electrode 41 and the movable electrode 24.

Then, when acceleration is applied along the arrow "X", direction shown in FIG. 1 within the horizontal direction of the substrate plane in the sensor chip 100, the entire portion of the movable unit 20 except for the anchor units 23a and 23b is displaced along the arrow "X" direction due to the spring function of the spring unit 22, and thus, the first and second capacitances CS1 and CS2 are changed in response to the displacement of the movable electrode 24 along the arrow "X" direction.

For example, in FIG. 1, the following detection operation is considered: That is, when the movable unit 20 is displaced downwardly along the arrow "X" direction, the following detection operation is carried out. At this time, the interval between the left-sided fixed electrode 31 and the movable electrode 24 is widened, and on the other hand, the interval between the right-sided fixed electrode 41 and the movable electrode 24 is narrowed.

As a consequence, this capacitance type acceleration sensor apparatus S1 can detect the acceleration along the arrow X direction based upon the change in the differential capacitance (CS1−CS2) caused by the movable electrode 24 and the fixed electrodes 31 and 41. A signal produced based upon this capacitance difference (CS1−CS2) is outputted as a sensor output signal from the sensor chip 100. Then, this sensor output signal is processed by the circuit chip 200 so as to be finally outputted.

Figure 5:
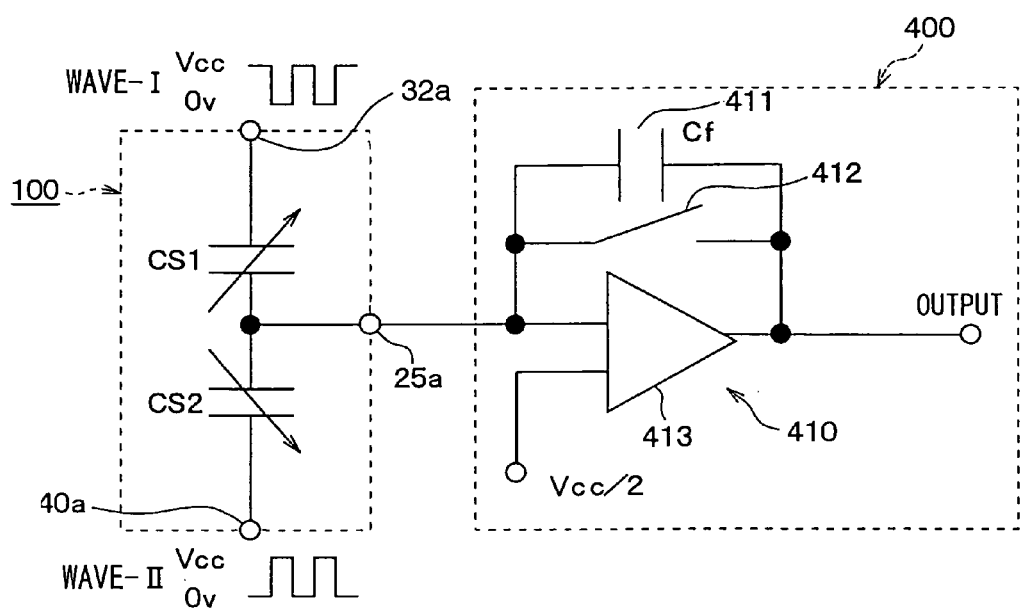
FIG. 5 is a circuit diagram showing a detection circuit of the apparatus according to the first embodiment.

FIG. 5 is a circuit diagram for showing one example of a detection circuit 400 which is used to detect acceleration in this capacitance type acceleration sensor apparatus S1.

In this detection circuit 400, a switched capacitor circuit (SC circuit) 410 is equipped with a capacitor 411 having a capacitance "Cf", a switch 412, and a differential amplifying circuit 413. This switched capacitor circuit 410 converts an entered capacitance difference (CS1−CS2) into a voltage.

Then, in the capacitance type acceleration sensor apparatus S1, for instance, a carrier wave WAVE-I having an amplitude Vcc is inputted from the left-sided fixed electrode-purpose pad 30a, and another carrier wave WAVE-II whose phase is shifted by 180 degrees from the phase of the carrier wave WAVE-I is inputted from the right-sided fixed electrode-purpose pad 40a, and the switch 412 of the SC circuit 410 is switched at predetermined timing.

Then, the acceleration applied along the arrow "X", direction is outputted as a voltage value "Vout" as represented in the below-mentioned formula No. 1:

$$Vout=(CS1-CS2)\cdot Vcc/Cf \quad \text{(Formula No. 1)}$$

Thus, the acceleration can be detected.

On the other hand, as to the below-mentioned capacitance type acceleration sensor apparatus S1 equipped with the sensor chip 100 and the circuit chip 200, the sensor apparatus S1 having the below-mentioned featured points may be provided. In the sensor chip 100 of the capacitance type acceleration sensor apparatus S1, the movable electrode 24, and both the fixed electrodes 31 and 41 arranged opposite to the movable electrode 24 are formed on the second silicon substrate 12 functioning as the semiconductor layer which is provided on the side of one plane 13 of the supporting substrate 11, namely on the side of the oxide film 13 of the first silicon substrate 11, while the movable electrode 24 can be displaced along the direction parallel to the substrate plane in response to the application of the acceleration. Then, this sensor chip 100 detects the acceleration based upon the change in the capacitances between the movable electrode 24 and the fixed electrodes 31 and 41 in response to the application of this acceleration. The circuit chip 200 processes the output signal from the sensor chip 100.

The featured points of the sensor apparatus S1 are given as follows:

Both the sensor chip 100 and the circuit chip 200 have been stacked under such a condition that the movable electrode 24 and both the fixed electrodes 31 and 41 employed in the sensor chip 100 are located opposite to the circuit chip 200. The sensor chip 100 has been electrically connected to the circuit chip 200 on the opposite planes where the sensor chip 100 is located opposite to the circuit chip 200.

Also, when the thickness of the movable electrode 24 along the stacked layer direction of both the sensor chip 100 and the circuit chip 200 is equal to "a"; the distance of the gap between the movable electrode 24 and the circuit chip 200 is equal to "b"; and the distance of the gap between the movable electrode 24 and one plane 13 of the supporting substrate 11 is equal to "c", both the distance "b" and the distance "c" are made smaller than the above-described thickness "a." The capacitance type acceleration sensor apparatus S1 of this first embodiment mode owns these featured points.

As a consequence, when the movable electrode 24 is tried to be displaced along the thickness direction thereof ("z") direction shown in FIG. 2 and FIG. 3), namely along the thickness direction of the sensor chip 100, i.e., along the stacked layer direction (upper/lower direction indicated in FIG. 4) of both the sensor chip 100 and the circuit chip 200, both one plane 13 of the first silicon substrate 11 and the circuit chip 200 may constitute a stopper.

In other words, the displacement of the movable electrode 24 to the chip stacked layer direction is restricted by both one plane 13 of the first silicon substrate 11 and the circuit chip 200, and thus, can be defined within the range for the thickness "a" of the movable electrode 24. As a consequence, it is possible to avoid that the movable electrode 24 runs onto the fixed electrodes 31 and 41.

As a consequence, in the capacitance type acceleration sensor apparatus S1 arranged by stacking the circuit chip 200 and the sensor chip 100 for detecting the acceleration based upon the capacitance change between the movable electrode 24 and the fixed electrodes 31 and 41, it is possible to avoid that the movable electrode 24 is displaced along the stacked layer direction of both the sensor chip 100 and the circuit chip 200 and runs onto the fixed electrodes 31 and 41.

In this case, the capacitance type acceleration sensor apparatus S1 owns one featured point such that both the sensor chip 100 and the circuit chip 200 have been electrically connected to each other via the bump electrode 300 which is made of a solder, gold, or the like.

Furthermore, in the capacitance type acceleration sensor apparatus S1 in which the sensor chip 100 has been electrically connected via the bump electrode 300 to the circuit chip 200, there is another featured point that since the thickness of the bump electrode 300 is made thin in such a manner that the thickness of this bump electrode 300 becomes equal to the distance "b", this distance "b" becomes smaller than the thickness "a."

The control of the thickness (namely, height) of this bump electrode 300 may be easily carried out by controlling the supply amount of the solder, by controlling the height when the solder is reflowed, otherwise by controlling the shape of the bump.

Second Embodiment

Figure 6:
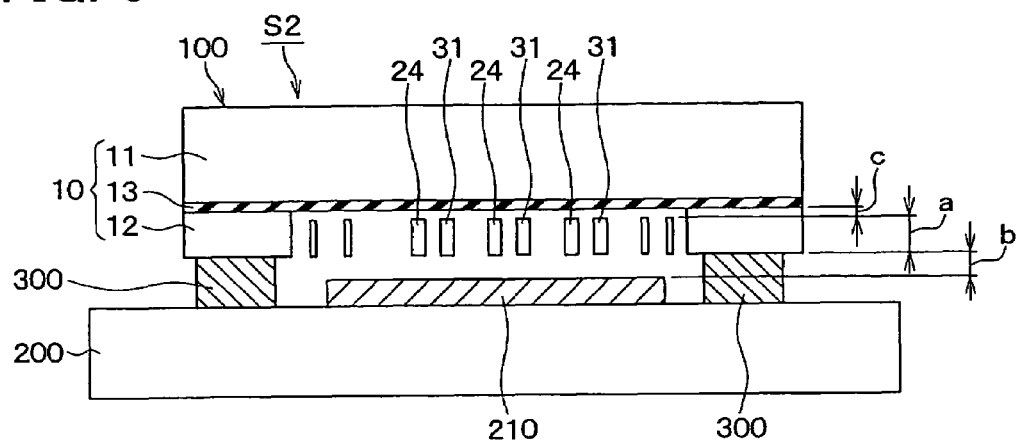
FIG. 6 is a cross sectional view showing a capacitance type acceleration sensor apparatus according to a second embodiment of the present invention.

FIG. 6 is a sectional view for schematically indicating a capacitance type acceleration sensor apparatus "S2" according to a second embodiment mode of the present invention, and represents such a condition that the sensor chip 100 is mounted on the circuit chip 200.

In accordance with the first embodiment mode, in such a sensor arrangement in which the sensor chip 100 has been electrically connected via the bump electrode 300 to the circuit chip 200, since the thickness of the bump electrode 300 is made thin in such a manner that the thickness of this bump electrode 300 becomes equal to the distance "b", this distance "b", becomes smaller than the thickness "a."

In contrast to the first embodiment mode, as shown in FIG. 6, in the capacitance type acceleration sensor apparatus S2 of this second embodiment mode, a film 210 is formed on a portion within the circuit chip 200, which is located opposite to movable electrodes (24) within the opposite plane of the sensor chip 100. This film 210 is constituted as a front surface of the circuit chip 200.

Then, since a distance between the front surface of this film 210 and the movable electrode 24 is made equal to the distance "b", of the gap between the movable electrode 24 and the circuit chip 200, this distance "b" is made smaller than the thickness "a" of the movable electrode 24.

In this case, the film 210 constructed as the front surface of the circuit chip 200 may be arranged as a protection film 210 capable of protecting the front surface of the circuit chip 200. This protection film 210 may be provided on the front most plane of the normal circuit chip 200, and may be made of, for example, a polyimide film.

Then, different from utilization of the thickness of the bump electrode 300 as explained in the first embodiment mode, the sensor apparatus S2 of the second embodiment mode can avoid that the movable electrode 24 runs onto the fixed electrodes 31 and 41 by utilizing the thickness of this protection film 210. The control of the thickness of the protection film 210 may be easily carried out when the protection film 210 is formed by way of a spin coat method, or the like.

In accordance with the capacitance type acceleration sensor apparatus S2, both one plane 13 of the first silicon substrate 11 and the film 210 of the circuit chip 200 may constitute a stopper, so that the displacement of the movable electrode 24 along the chip stacked layer direction (namely, along "z" direction shown in FIG. 2 and FIG. 3, and along upper/lower direction shown in FIG. 4) may be restricted within the range of the thickness "a" of the movable electrode 24.

As a consequence, in the capacitance type acceleration sensor apparatus S2 arranged by stacking the circuit chip 200 and the sensor chip 100 for detecting the acceleration based upon the capacitance change between the movable electrode 24 and the fixed electrodes 31 and 41, it is similarly possible to avoid that the movable electrode 24 is displaced along the stacked layer direction of both the sensor chip 100 and the circuit chip 200, and thus, runs onto the fixed electrodes 31 and 41.

Third Embodiment

Figure 7:
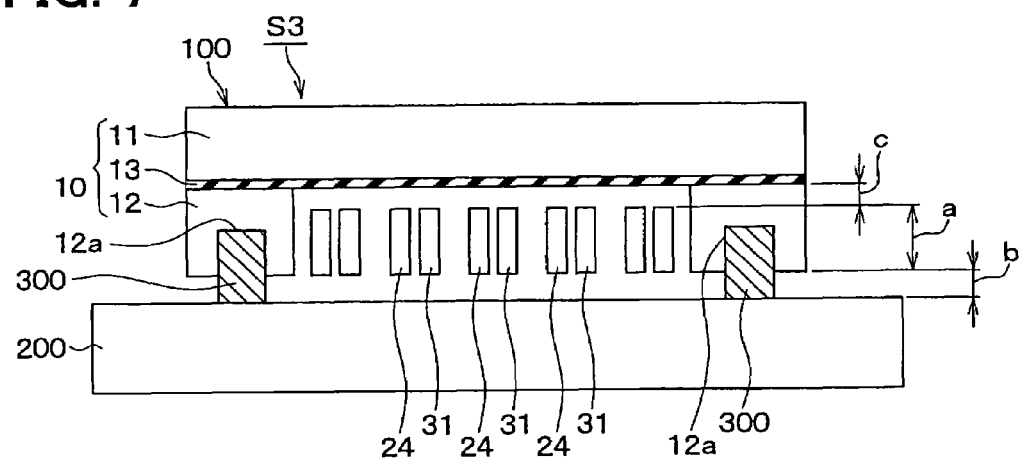
FIG. 7 is a cross sectional view showing a capacitance type acceleration sensor apparatus according to a third embodiment of the present invention.

FIG. 7 is a sectional view for schematically indicating a capacitance type acceleration sensor apparatus "S3" according to a third embodiment mode of the present invention, and represents such a condition that the sensor chip 100 is mounted on the circuit chip 200.

In the first embodiment mode, since the thickness of the bump electrode 300 is made thick in such a manner that the thickness of the bump electrode 300 becomes equal to the distance "b" of the gap between the movable electrode 24 and the circuit chip 200, the distance "b" is made smaller than the thickness "a" of the movable electrode 24.

As indicated in FIG. 7, in contrast to the first embodiment mode, in the capacitance type acceleration sensor apparatus S3 of the third embodiment mode, a concave portion 12a is provided at such a portion in the sensor chip 100, in which the bump electrode 300 is provided. A portion of the bump electrode 300 is entered into this concave portion 12a.

Then, since a thickness of such a portion of the bump electrode 300 which is projected from the concave portion 12a is made equal to the distance "b" of the gap between the movable electrode 24 and the circuit chip 200, the distance "b" is made smaller than the thickness "a" of the movable electrode 24.

In this case, the concave portion 12a has been provided in the front surface of the second silicon substrate 12 functioning as the semiconductor layer in the sensor chip 100. This concave portion 12a may be easily formed by etching this second silicon substrate 12 by way of a dry etching process, or the like.

Then, in accordance with the capacitance type acceleration sensor apparatus S3, both one plane 13 of the first silicon substrate 11 and the circuit chip 200 may constitute a stopper, so that the displacement of the movable electrode 24 along the chip stacked layer direction (namely, along "z" direction shown in FIG. 2 and FIG. 3, and along upper/lower direction shown in FIG. 4) may be restricted within the range of the thickness "a" of the movable electrode 24.

As a consequence, in the capacitance type acceleration sensor apparatus S3 arranged by stacking the circuit chip 200 and the sensor chip 100 for detecting the acceleration based upon the capacitance change between the movable electrode 24 and the fixed electrodes 31 and 41, it is possible to avoid that the movable electrode 24 is displaced along the stacked layer direction of both the sensor chip 100 and the circuit chip 200, and thus, runs onto the fixed electrodes 31 and 41.

Moreover, since the depth of the concave portion 12a is controlled and the bump electrode 300 is entered into this concave portion 12a, it is easily possible to realize that the distance "b" can be made smaller than the thickness "a" of the movable electrode 24. In particular, there are such merits that the shape of the bump electrode 300 need not be changed, but also need not be necessarily made thin.

On the other hand, in the example shown in FIG. 7, the concave portion 12a has been formed on the side of the sensor chip 100. Conversely, the concave portion 12a may be alternatively provided in such a portion within the circuit chip 200, where the bump electrode 300 is arranged. Also, concave portions 12a may be alternatively provided in both sides of the sensor chip 100 and the circuit chip 200.

(Modifications)

It should be understood that in the above-described embodiment modes, the sensor chip 100 and the circuit chip 200 have been electrically connected to each other via the bump electrode 300 at the mutual opposite planes thereof. The electric connection between the sensor chip 100 and the circuit chip 200 may be merely carried out at the mutual opposite planes thereof. Alternatively, this electric connection may be carried out by way of, for instance, an electric conductive adhesive agent, a crimping manner, and the like, other than the above-explained bump electrode 300.

Also, in the above-described embodiment modes, while the oxide film 13 has been left over the entire region on the SOI substrate 10, the thin wall rectangle portion 15 has been formed in the second silicon substrate 12, so that the movable unit 20 is released. Alternatively, as well known in this technical field, since an etching process may be carried out in the SOI substrate 10 by employing the oxide film 13 as a sacrifice layer, the movable unit 20 may be released.

In the case that this sacrifice layer etching process is employed, as to the thickness of the second silicon substrate 12, the entire region thereof may become substantially uniform. Then, the oxide film 13 is removed in the portion of the rectangular shape 15 shown in FIG. 1 is removed, so that the movable unit 20 may be released from the supporting substrate 11.

Also, in this case, the first silicon substrate 11 is constituted as the supporting substrate. In this case, the oxide film 13 located under the movable unit 20 is removed, so that the plane itself in the first silicon substrate 11, which is located opposite to the second silicon substrate 12, may be arranged as one plane of the supporting substrate. Then, a distance "c" of a gap between the movable electrode 24 and one plane of the supporting substrate 11 may be nearly equal to the thickness of the oxide film 13.

Also, in the above-described embodiment modes, the SOI substrate 10 has been employed as the substrate which constructs the sensor chip 100. If such a substrate may have a semiconductor layer on one plane side of a supporting substrate and both a movable electrode and a fixed electrode may be formed on this semiconductor layer, any other substrates than the SOI substrate 10 may be alternatively employed as a substrate for constituting the sensor chip 100.

It should also be noted that as previously explained in the embodiment mode, it is required to employ a front surface processing type physical quantity sensor as the sensor chip, and such a rear surface processing type physical quantity sensor shown in FIG. 8 is eliminated.

In other words, as the sensor chip, the below-mentioned sensor chip is required. That is, while a movable electrode is formed on a supporting substrate, the supporting substrate owns a gap with respect to the movable electrode just under the movable electrode.

Also, the capacitance type physical quantity sensor apparatus of the present invention is not apparently limited only to the above-described acceleration sensors, but the present invention may be applied to other physical quantity sensors, for example, angular velocity sensors capable of detecting angular velocities as physical quantities in addition to the acceleration sensors.

In summary, the capacitance type physical quantity sensor apparatus owns the following major featured points. That is, in this capacitance type physical quantity sensor apparatus arranged by stacking the circuit chip and the sensor chip for detecting the acceleration based upon the capacitance change between the movable electrode and the fixed electrodes, which have been formed on one plane of the supporting substrate, both the sensor chip and the circuit chip are stacked to each other under such a condition that both the movable electrode and the fixed electrode employed in the sensor chip are located opposite to the circuit chip. Also, while these sensor and circuit chips are electrically connected to each other at the opposite planes thereof, both the distance "b" of the gap between the movable electrode and the circuit chip, and the distance "c" of the gap between the movable electrode and one plane of the supporting substrate are made smaller than the thickness "a" of the movable electrode along the stacked layer direction of both the circuit chip and the sensor chip. Other detailed portions of this capacitance type physical quantity sensor apparatus may be properly modified.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A capacitance type physical quantity sensor comprising:
    a sensor chip for detecting a physical quantity; and
    a circuit chip for processing a signal outputted from the sensor chip, wherein the sensor chip includes:
        a support substrate;
        a semiconductor layer disposed on one side of the substrate;

a movable electrode disposed in the semiconductor layer and displaceable in a direction parallel to the substrate in accordance with the physical quantity; and a fixed electrode disposed in the semiconductor layer and facing the movable electrode, the sensor chip is capable of detecting the physical quantity on the basis of a capacitance change of a capacitor provided between the movable electrode and the fixed electrode, the capacitance change is provided by a displacement of the movable electrode in accordance with the physical quantity, the sensor chip is stacked on the circuit chip in such a manner that the movable electrode and the fixed electrode face the circuit chip, the sensor chip is electrically connected to the circuit chip, the movable electrode has a thickness in a stacking direction of the sensor chip, the sensor chip has a first distance between the movable electrode and the circuit chip and a second distance between the movable electrode and the support substrate, and the thickness of the movable electrode is larger than the first distance and the second distance, wherein the circuit chip includes a protection film disposed on one side of the circuit chip, and the protection film faces the movable electrode so that a distance between a surface of the protection film and the movable electrode provides the first distance.

2. The sensor according to claim 1, wherein
the sensor chip is electrically connected to the circuit chip through a bump electrode.

3. The sensor according to claim 2, wherein
the bump electrode has a thickness in the stacking direction of the sensor chip, and
the thickness of the bump electrode is equal to the first distance.

4. The sensor according to claim 2, wherein
the sensor chip further includes a concavity disposed on a part of the sensor chip,
the bump electrode has a part, which is inserted into the concavity,
the other part of the bump electrode is protruded from the concavity,
the other part of the bump electrode has a thickness in the stacking direction of the sensor chip, and
the thickness of the other part of the bump electrode is equal to the first distance.

5. The sensor according to claim 1, wherein
the protection film is capable of protecting the one side of the circuit chip.

6. The sensor according to claim 1, wherein
the sensor chip further includes an insulation layer disposed between the support substrate and the semiconductor layer, and
the second distance is provided between the movable electrode and the insulation layer.

7. The sensor according to claim 6, wherein
the movable electrode is supported on the substrate through the insulation layer in such a manner that the movable electrode is separated from the substrate by the second distance, and
the movable electrode has a displacement range, which is limited between the insulation layer and the one side of the circuit chip.

* * * * *